(12) United States Patent
Geyer

(10) Patent No.: US 7,091,062 B2
(45) Date of Patent: Aug. 15, 2006

(54) WAFER LEVEL PACKAGES FOR CHIPS WITH SAWN EDGE PROTECTION

(75) Inventor: Stefan Geyer, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/967,020

(22) Filed: Oct. 15, 2004

(65) Prior Publication Data

US 2005/0110156 A1    May 26, 2005

(30) Foreign Application Priority Data

Oct. 15, 2003  (DE)  ................. 103 48 640
Oct. 13, 2004  (DE)  ............... 10 2004 050 027

(51) Int. Cl.
*H01L 21/44* (2006.01)
(52) U.S. Cl. ...................... 438/114; 438/462
(58) Field of Classification Search ........ 438/110–114, 438/458–465
See application file for complete search history.

(56) References Cited

U.S. PATENT DOCUMENTS

| | | | |
|---|---|---|---|
| 5,306,370 A * | 4/1994 | Herko et al. ............. 156/155 |
| 5,851,845 A | 12/1998 | Wood et al. | |
| 6,046,073 A | 4/2000 | Lang et al. | |
| 6,288,443 B1 | 9/2001 | Finn et al. | |
| 6,350,664 B1 | 2/2002 | Haji et al. | |
| 6,448,151 B1 * | 9/2002 | Tateishi .................. 438/458 |
| 6,683,379 B1 | 1/2004 | Haji et al. | |
| 2002/0197771 A1 | 12/2002 | Dotta et al. | |

FOREIGN PATENT DOCUMENTS

| | | |
|---|---|---|
| DE | 196 51 566 A1 | 6/1998 |
| DE | 197 52 404 C1 | 8/1999 |
| DE | 100 43 172 A1 | 5/2001 |
| DE | 101 64 494 A1 | 7/2003 |

* cited by examiner

Primary Examiner—David Nelms
Assistant Examiner—Quoc Hoang
(74) Attorney, Agent, or Firm—Slater & Matsil, L.L.P.

(57) ABSTRACT

The invention relates to a wafer level package for chips with chip edge protection, comprising individual chips, which can in each case be mounted on a suitable carrier board, and to a method for producing such a wafer level package. Aspects of the invention can be achieved by the chip being thinned extremely from the back side and bonded onto a fiber reinforced synthetic resin sheet, forming a solidly bonded assembly that cannot come apart in the customary temperature range, and the edges of the assembly being at least partly coated with a polymer.

22 Claims, 2 Drawing Sheets

WAFER LEVEL PACKAGES FOR CHIPS WITH SAWN EDGE PROTECTION

This application claims priority to Ciennan Pat. Application 103 48 640.2, which was flled Oct. 15. 2003 and to German Patent Application 10 2004 050 027.4, which was filed Oct 13, 2004, both of which applications are incorporated herein by reference.

TECHNICAL FIELD

The invention relates to a wafer level package for chips with chip edge protection, comprising individual chips, which can in each case be mounted on a suitable carrier board, and to a method for producing such a wafer level package.

BACKGROUND

It has been found that the wafer level package (WLP) is currently the least expensive package of all. The reason for this is that the chips are contacted directly on a PCB (Printed Circuit Board) and the wire bonding, the critical leadframe and the encapsulation are no longer needed. The wafer level package has extremely small dimensions combined with extremely good electrical properties. In addition, all possibilities for testing and reworking are retained, and customary pick-and-place machines for printed circuit boards can be used.

"Wafer level package" is to be understood as meaning that the entire packaging and all the interconnections on the wafer as well as other processing steps are carried out before the singulation (dicing) into chips (dies). These singulated chips are then mounted directly on a substrate.

Furthermore, chips require an enclosure of a synthetic material, for example a polymer. This enclosure has the task of protecting the chip from corrosive environmental influences, in particular at the sawn edge in the region of the sequence of layers, and also, on a micromechanical level, protecting the fine bonding wires from damage and, on a macromechanical level, protecting the hard but brittle silicon from rupture.

This protection is brought about in the case of most chips or packages by enclosure in a synthetic material, known as a mold cap. For this purpose, the package together with the leadframe or some other carrier element, is completely encapsulated in a thermocuring epoxy resin (molding compound) in a mold. In this operation, the sawn edges, the bonding wires and the silicon are protected and, at the same time, the leadframe or the carrier element is incorporated.

In the case of the less expensive WLP, the task of protecting the bonding wires and the incorporation of the leadframe are no longer needed. In the case of the WLP, all that is necessary is to protect the sawn edges in the region of the layers from corrosive environmental influences and to protect the brittle silicon from the back side. To achieve this, the chips are singulated from the wafer assembly and respectively mounted on a board, for example in a way corresponding to flip-chip technology, and the back side of the chip and the sawn edges of the chip are subsequently encapsulated in a thermocuring epoxy resin.

However, the WLP has the disadvantage that it can only be used for small chips with an edge length of up to at most 2.5 mm. The reason for this is that larger chips have longer displacements under expansion (great DNP), which, in combination with the very different coefficients of expansion of 2.3 ppm/K in the case of the chip and 20 ppm/K in the case of the printed circuit board (PCB, glass-fiber reinforced epoxy resin), bring about a gradual detachment of the external soldered connections under the unavoidable temperature changes taking place. This means that the chips may fail prematurely in the thermal cycling test on the board (PCB), in that soldered connections develop cracks.

To circumvent this problem, two basic possibilities have so far become known.

The first possibility is to bring about a kind of "constrained securement" of the chip and printed circuit board. This can be achieved for example by an "underfill" between the chip and the printed circuit board, or a "polymer collar," which partly encloses the solder balls on the chip.

However, the "constrained securement" in the case of the "underfill," that is the introduction of a molding material between the chip and the printed circuit board by using capillary action, has the disadvantage that a repair (reworking) is only possible with difficulty. In addition, the "underfill" requires an additional working step. Furthermore, in the case of very large chips, such as DRAMs, the "underfill" is not adequately reliable in the long term.

The use of a "collar" has only a limited effect and is not adequate in the case of large chips, such as DRAMs.

The second possibility is that of a "free securement" of the chip and the printed circuit board. This can be achieved for example by "microsprings" (connecting elements designed in the manner of springs), "soft bumps" (elastic or compliant contact bumps), the use of a chip mounting film (tape), or a "double ball redistribution" (wiring interposer with in each case two contact balls one above the other, the lower contact ball being embedded in epoxy resin).

However, it can be stated that all the "free securements" have a major disadvantage in common. If the distance (H) between the chip and the printed circuit board is small (the shearing force at the solder ball is proportional to DNP divided by H), the "gain in freedom," and consequently the "gain in reliability," is also small. If the distance (H) between the chip and the printed circuit board is great, the "gain in freedom," and consequently the "gain in reliability," is indeed great, but at the same time the construction becomes thicker, which is at odds with increasing miniaturization.

This relationship can be expressed by a general formula:

$$\gamma = \Delta T (CTE_{die} - CTE_{board}) DNP/H$$

where
  γ=shearing force
  CTE=coefficient of thermal expansion of the die or of the board
  ΔT=temperature range of the stress cycle
  DNP=distance to the neutral point of the soldered connections
  H=distance between die (chip) and board It is evident from this formula that the shearing force depends in particular on H and decreases with increasing H.

U.S. Pat. No. 5,851,845 discloses a method for the packaging of a semiconductor chip. This method is based on the problem that, in the chip-on-board mounting of an unpackaged chip on a printed circuit board, a thermally induced stress occurs. This thermal stress is produced by the mismatch between the coefficients of thermal expansion (CTE) of the chip and the printed circuit board.

The method therefore provides that a thinned chip in the wafer assembly is mounted on a substrate with a compliant adhesive layer interposed. The compliant adhesive layer has the task of absorbing thermally induced stress. Silicon, ceramic or else glass-fiber reinforced epoxy resin (e.g. FR-4) may be used as the substrate material. Polyimide, epoxy resin, silicone or the like come into consideration for example for the compliant adhesive layer. After singulation, the correspondingly equipped chip can then be mounted on printed circuit boards.

Finally, U.S. Pat. Publication No. 2002/197771 A1 discloses a method for thinning a wafer by means of CMP (chemical mechanical polishing) and also an arrangement for protecting the thinned chips. To protect the chip from damage or rupture, a reinforcing means is applied to its back side. A flat sheet or a polyimide or polysilicone coating is used here as the reinforcing means. The invention is therefore based on the object of presenting a wafer level package which eliminates the disadvantages of the prior art. Problems of thermal mismatch and of board level reliability are eliminated, the accomplishment of adequately thin structures is allowed and dependable protection of the chip edges is allowed. Furthermore, methods by which such a wafer level package can be accomplished are to be presented.

This is achieved by the chip being thinned extremely from the back side and bonded onto a fiber reinforced synthetic resin sheet, forming a solidly bonded assembly that cannot come apart in the customary temperature range, and the edges of the assembly being at least partly coated with a polymer.

The synthetic resin sheet may in this case be mounted on the back side or the front side of the chip.

In continuation of the invention, the synthetic resin sheet on the front side of the chip is provided with via holes at the same pitch as the solder balls which are mounted on the side of the synthetic resin sheet that is opposite from the chip, the chip being mounted "face-down" on the synthetic resin sheet and electrically connected by the via holes.

The thickness of the thinned chips is around 10 µm to 100 µm and the thickness of the synthetic resin sheet is around 100–2000 µm.

The chips are preferably equipped with an M3-RDL system and with solder balls in a square 0.5 mm pitch.

SUMMARY OF THE INVENTION

In one aspect, the present invention is characterized in that a wafer is firstly attached "face-down" (that is with the active side downward) on a temporary carrier and is subsequently thinned from the back side mechanically and then wet-chemically to an intended thickness, in that the back side of the wafer is firstly oxidized on a monolayer basis and subsequently provided with a silane primer, in that subsequently a wafer-sized synthetic resin sheet is adhesively bonded onto the back side of the wafer and in that, after removal of the temporary carrier, the "wafer" is sawn into from the chip side to a predetermined depth, forming kerfs, in that subsequently a light-sensitive polymer is applied on the chip side, exposed and developed, so that the kerfs are coated on both sides with the polymer, and in that the wafer is sawn up into individual "chips" from the side that has the synthetic resin sheet.

A second method is characterized in that a wafer equipped with solder balls in the square 0.5 mm pitch is adhesively attached "face-down" onto a wafer-sized synthetic resin sheet which is provided with via holes in the same pitch as the solder balls, in that subsequently the wafer is thinned from the back side and then printed with a synthetic resin, in that the side that has the via holes and is opposite from the wafer is provided with solder balls and the "wafer" is subsequently sawn into from the chip side to a predetermined depth, forming kerfs, in that subsequently a light-sensitive polymer is applied on the chip side, exposed and developed, so that the kerfs are coated on both sides with the polymer, and in that the wafer is sawn up into individual "chips" from the side that has the synthetic resin sheet.

The thinning of the wafer takes place here to a thickness of about 10 µm.

A third method is characterized in that a wafer equipped with solder balls in the square 0.5 mm pitch is sawn up into individual chips, in that a multiplicity of the chips are soldered onto a copper-clad synthetic resin sheet which is equipped with via holes and a wiring interposer from the 0.5 mm pitch on the chip side to a 0.8 mm pitch on the board side, in that the chips are thinned from the back side in atmospheric downstream fluorinated plasma and underfilled with a low-viscosity synthetic resin and printed, in that the synthetic resin carrier is provided with solder balls on the side that is opposite from the chips, in that subsequently a light-sensitive polymer is applied on the chip side, exposed and developed, so that the chip edges are coated with the polymer, and in that the synthetic material sheet is sawn up into "chips".

Here, the chips are preferably thinned to a thickness of about 10 µm.

A fourth method is characterized in that a wafer equipped with solder balls in the square 0.5 mm pitch is sawn up into chips and in that the chips are soldered onto a printed circuit board, in that the chips are thinned in an atmospheric downstream fluorinated plasma, washed free of ions and subsequently underfilled with a low-viscosity synthetic resin and printed.

The thinning of the chips takes place here to a thickness of about 10 µm.

The problem of board level reliability in the case of wafer level packaging for any size of chips, such as DRAMs for example, is solved by the invention in that the chip is thinned on the non-active side so extremely that it can follow without any problem the relatively great displacements under expansion of the fiber reinforced synthetic resin sheet, for example a glass-fiber reinforced epoxy resin (standard printed circuit board material), with which it is solidly bonded via the back side of the chip or the front side of the chip.

A chip thinned in this way can follow the expansion of the PCB without any problem, since a maximum reversible expansion of Si with a thickness of 60+−25 µm of 0.5% is possible. This means that silicon solidly bonded to a glass-fiber reinforced epoxy resin with a coefficient of expansion of 20 ppm/K (=0.002% K) dependably withstands a temperature change of 250 K (0.002%/K×250 K=0.5%).

An advantage of the invention is that it achieves extremely great reliability, even for chips of any size, very good electrical values, a very small (thin), very stable and very robust form of construction combined with low production costs. At the same time, extremely inexpensive chip edge protection is achieved.

To sum up, one aspect of the invention is that the chip/wafer is thinned extremely and subsequently bonded to a sheet material which has a coefficient of expansion which is the same as or similar to that of the board, so that the silicon can and must follow the great displacements under expansion of the board without detachment of soldered connections occurring.

BRIEF DESCRIPTION OF THE DRAWINGS

The invention is to be explained in more detail below by means of exemplary embodiments. In the associated figures of the drawing.

Figure 1:
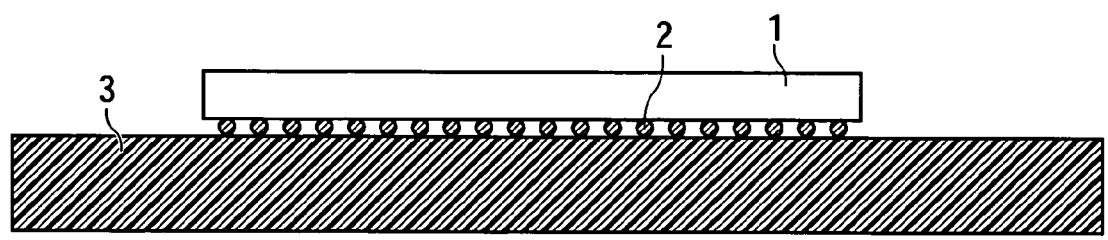
FIG. 1 shows a wafer level package according to the prior art, in which a chip is mounted on a board with the aid of solder balls.

The following list of reference symbols can be used in conjunction with the figures 1 chip
2 solder ball
3 board (printed circuit board)
4 synthetic material sheet
5 "chip," solidly bonded assembly
6 sawing edge
7 kerf
8 polymer

DETAILED DESCRIPTION OF ILLUSTRATIVE EMBODIMENTS

FIG. 1 shows a wafer level package according to the prior art, in which a chip 1 is mounted on a board 3 (glass-fiber reinforced printed circuit board) with the aid of solder balls 2. As described at the beginning, crack formation in the solder balls 2 can occur here as a result of the different coefficients of thermal expansion.

Figure 2:
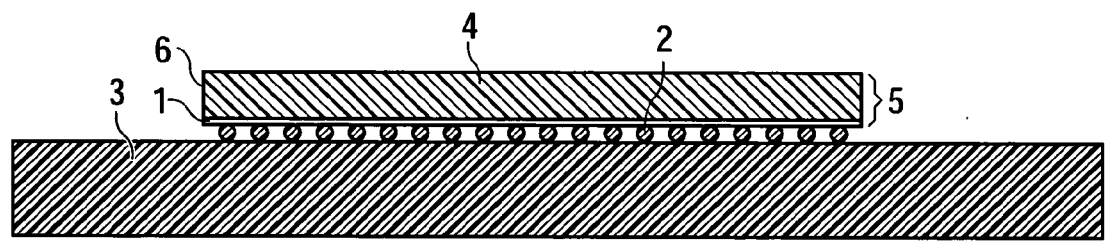
FIG. 2 shows a wafer level package according to the invention, in which the chip is thinned extremely and is bonded on the back side to a glass-fiber reinforced synthetic resin sheet, forming an assembly which cannot come apart.

Represented in FIG. 2 is a WLP according to the invention, in which an extremely thinned chip 1 has been laminated onto a glass-fiber reinforced synthetic resin sheet 4 so as to be undetachable in the normal temperature range, so that an assembly 5 that cannot come apart in the normal temperature range is produced between the chip 1 and the synthetic resin sheet 4. This assembly is provided on the chip side with solder balls 2, which are mounted on a board 3 by soldering to solder contacts (not represented), which are connected to conductor (e.g., Cu) tracks.

The solid bond between the chip 1 and the glass-fiber reinforced synthetic resin sheet 4 has the effect of enforcing the expansion behavior of the synthetic resin sheet 4 on the chip 1, so that the CTE of the assembly 5 corresponds to that of the board, and consequently a thermally induced stress of the solder balls 2 is avoided.

Exemplary Embodiment 1:

This exemplary embodiment relates to a chip-sized epoxy resin chip back-side carrier (fiber reinforced synthetic material sheet 4) for receiving the chip 1, as a preferred variant.

For this purpose, a wafer which is preferably equipped with an M3-RDL system (RDL: Redistribution Layer) and with solder balls 2 in a square 0.5 mm pitch and has DRAMs is thinned from the back side on a temporary carrier, firstly mechanically and subsequently wet-chemically, for example by wet-chemical mechanical polishing (CMP), to a thickness of about 35 µm.

Subsequently, the wafer thinned in this way on the temporary carrier is oxidized on a monolayer basis and provided with a silane primer. After that, a 350 µm thick wafer-sized glass-fiber reinforced synthetic resin sheet 4 is adhesively attached on the back side of the wafer and the assembly is cured.

Subsequently, the temporary carrier can be removed and the "wafer" sawn up into individual "chips" 5 for the WLP and the sawn edges 6 printed with an epoxy resin for protection. However, this sawn edge protection is relatively laborious to accomplish, since each "chip" 5 is individually printed.

Figure 3:
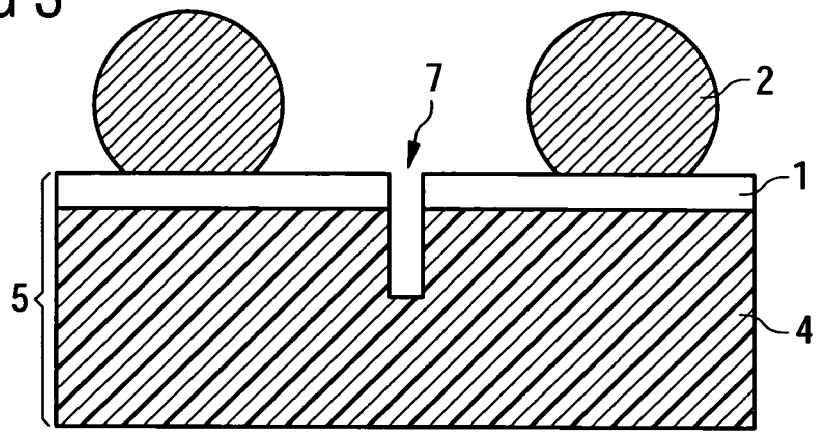
FIG. 3 shows a schematic sectional representation of the assembly as shown in FIG. 2, provided with a kerf.
Figure 4:
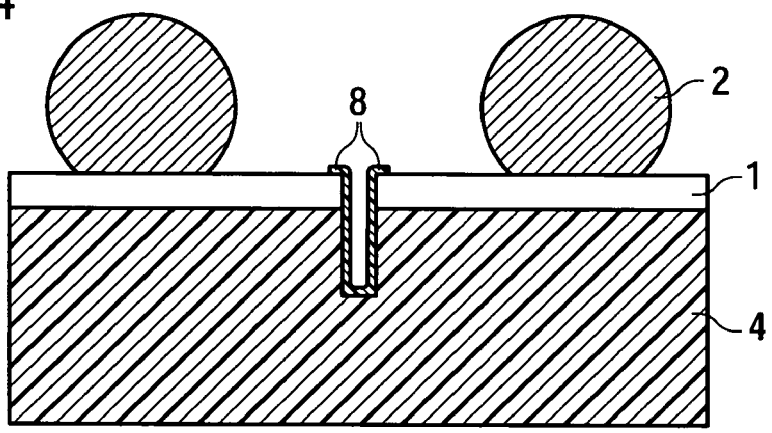
FIG. 4 shows the kerf as shown in FIG. 3 after the coating with a polymer.
Figure 5:
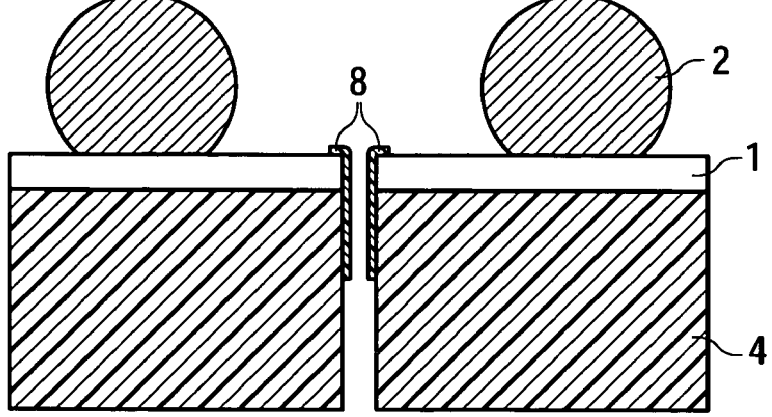
FIG. 5 shows chips singulated by sawing in from the back side and provided with a chip edge protection.

A much less expensive variant for chip edge protection is represented in FIGS. 3–5. For this purpose, a thin saw blade, with a thickness of for example 48 µm, is used to saw into the finished "wafer" from the chip side in a way corresponding to the chip-to-chip spacing to a predetermined depth (FIG. 3), so that crossing sawing gaps 7 are produced.

Subsequently, a thin layer of synthetic material is applied to the chip side, which may take place for example by spin-coating a light-sensitive polymer 8 (PI or BCB) after the customary HMDS hydrophobing of the "wafer." It must be ensured here that the sawing gaps 7 are not completely filled. The polymer 8 is then exposed and developed, so that then finally only the chip edges in the sawing gaps 7 are coated.

The final singulation of the "wafer" into "chips" then takes place from the back side of the wafer, by the synthetic resin sheet 4 being finally sawn through.

Since, on the basis of the configuration according to the invention, the "wafer" and "chips" 5 consist of 90% of glass-fiber reinforced epoxy resin, the designations "wafer" and "chip" are given in inverted commas.

Exemplary Embodiment 2:

This exemplary embodiment relates to a chip-sized epoxy resin chip front-side leadframe for receiving a chip 1.

For this purpose, a wafer which is preferably equipped with an M3-RDL system (RDL: Redistribution Layer) and with solder balls in a square 0.5 mm pitch and has DRAMs is adhesively attached "face down" onto a 350 µm thick wafer-sized glass-fiber reinforced epoxy resin sheet with vertical via holes in the same pitch as the solder balls for interfacial connection.

Subsequently, the bonded assembly formed in this way is thinned wet-chemically from the back side of the wafer to a thickness of the silicon of 35 µm. After that, the entire back side of the wafer is completely printed with an epoxy resin for protection and the side that is opposite from the via holes is provided with solder balls.

Finally, the "wafer" changed in this way is sawn into individual "chips" 5. The protection of the sawn edges may take place here in the same way as in the case of exemplary embodiment 1.

Exemplary Embodiment 3:

This exemplary embodiment relates to an epoxy resin chip front-side leadframe for receiving a chip which is slightly larger than the chip itself.

For this purpose, a wafer which is preferably equipped with an M3-RDL system (RDL: Redistribution Layer) and with solder balls in a square 0.5 mm pitch and has DRAMs is sawn up into chips. After that, the chips are soldered by the customary technique onto a 400 µm thick glass-fiber reinforced epoxy resin board carrying several hundreds of chips. The epoxy resin board is provided with a copper cladding, via holes and a wiring interposer (0.5 mm pitch on the chip side and 0.8 mm standard pitch on the board side).

Subsequently, the chips mounted on the carrier are thinned in an atmospheric downstream fluorinated plasma to 25 μm and then underfilled with a high-viscosity epoxy resin and printed.

After that, the opposite side of the carrier is provided with solder balls and the carrier is sawn up into "chips," after which the chip edge protection is produced in the same way as in exemplary embodiment 1.

Exemplary Embodiment 4:

This exemplary embodiment relates to chip-on-board systems, the chip having subsequently been thinned and encapsulated.

In order to achieve this, a wafer which is preferably equipped with an M3-RDL system (RDL: Redistribution Layer) and with solder balls in a square 0.5 mm pitch and has DRAMs is sawn up into chips. These chips are then soldered by the customary technique together with other chips onto a board. Subsequently, the bare chips are thinned on the board in an atmospheric downstream fluorinated plasma to 25 μm and washed free of ions. After that, the chips are underfilled with a low-viscosity epoxy resin and printed.

The thinning is possible on the board, since Cu, Al, Ni, Sn, Pb and organic resins are scarcely attacked at all by the fluorinated plasma.

The protection of the sensitive chip edges 6 can subsequently be performed by spin-coating, exposing and developing a polymer.

What is claimed is:

1. A method for producing a wafer level package, the method comprising;
    providing a semicondctor wafer having a chip side and a back side;
    thinning the back side of the wafer to an intended thickness;
    attaching a wafer-sized fiber reinforced synthetic resin sheet onto the wafer to form a wafer assembly that inchides the wafer and the fiber reinforced synthetic resin sheet;
    sawing into the wafer assembly from the chip 'side to a predetermined depth to form kerfs;
    applying a polymer to the chip side of the wafer assembly so that inner surfaces of the kerfs are coated with the polymer, end
    sawing the wafer assembly into individual chips wherein applying a polymer comprises applying a light-sensitive polymer to thc chip side of the wafer assembly and exposing and developing the light-sensitive polymer to the chip side of the wafer assembly and exposing and developing the light-sensitive polymer so that the inner surfaces of the kerfas are coated with the polymer.

2. The method of claim 1 and further comprising oxidizing a back side of the wafer and providing a primer on the back aide of the wafer after thinning the wafer.

3. The method of claim 2 wherein oxidizing a back side of the wafer comprises oxidizing a back side of the wafer on a monolayer basis.

4. The method of claim of wherein providing a primer comprises providing a silane primer on the back side of the wafer.

5. The method of claim wherein thinning the wafer comprises mechanically thinning the wafer and then wet-chemically thinning the wafer.

6. The method of claim 1 wherein sawing the wafer assembly comprises sawing the wafer assembly into individual chips from the side that has the synthetic resin sheet.

7. The method of claim 1 wherein:
    providing a semiconductor wafer comprises providing a wafer that includes solder balls in a pitch;
    attaching a wafer-sized fiber reinforced synthetic resin sheet comprises adhesively attaching the wafer face-.down onto the wafer-sized fiber reinforced synthetic resin sheet to form a wafer assembly the wafer.sized fiber reinforced synthetic resin sheet including via holes in the same pitch as the solder balls;
    wherein thinning a backside of the wafer comprises thinning the wafer wet-chemically from the back side;
    wherein applying a polymer comprises applying a light-sensitive polymer on the chip side of the wafer assembly and exposing and developing the light sensitive polymer so that the kerfs are coated on both sides with the plynier; the method further comprising:
    printing the wafer assembly with a symthetic resin; providing solder balls to a side of the wafer assembly that has the vie boles and is opposite from the wafer.

8. The method of claim 7 wherein providing a wafer comprises providing a wafer that includes solder balls in the square 0.5 mm pitch.

9. The method of claim 7 wherein thinning the wafer comprises thinning the wafer a thickness of about 10 μm.

10. The method of claim 1 wherein attaching a wafer-sized fiber reinforced synthetic resin shoot to the wafer comprises attaching a wafer-sized fiber reinforced synthetic resin sheet to the backside of the wafer.

11. The method of claim 10 and further comprising attaching a front side of a wafer to a temporary carrier prior to thinning the wafer to an intended thickness.

12. The method of claim 11 and further comprising removing the wafer from the temporary carrier after adhesively bonding a wafer-sized fiber reinforced synthetic resin sheet onto the back side of the wafer.

13. The method of claim 10 and further comprising oxidizing a back side of the wafer end providing a primer on the back side of Ibe wafer after thinning the wafer but prior to adhesively bonding a wafer-sized Tibet reinforced synthetic resin sheet onto the back side of the wafer.

14. The method of claim 13 wherein oxidizing a back side of the wafer comprises oxidizing a back side of the wafer on a monolayer basis.

15. The method of claim 13 wherein providing a primer comprises providing a silane primer on the back side of the wafer.

16. Thc method of claim 1 wherein attaching comprises adhesively bonding.

17. The method of claim 1 wherein attaching a wafer-sized fiber reinforced synthetic resin sheet to the wafer comprises attaching a wafer-sized fiber reinforced synthetic resin sheet to a frontside of the wafer.

18. The method of claim 17 wherein the semiconductor wafer includes solder balls in a pitch.

19. The method of claim 18 wherein the wafer-sized fiber reinforced synthetic resin sheet includes via holes in the same pitch as the solder balls.

20. Th. method of claim 17, wherein thinning comprises thinning the wafer wet-chemically from a back side of the wafer.

21. The method of claim 17, further comprising, before sawing the wafer assembly, providing solder balls to a side of the wafer assembly that has the via holes and.

22. A method for producing a wafer level package, the method comprising:

attaching a front side of a wafer to a temporary carrier;

after attaching the wafer to the temporary carrier, thinning the wafer mechanically and then wet-ethnically to an intended thickness;

oxidizing a back side of the wafer so that the back side is oxidized on a monolayer basis;

after oxidizing, providing the back side of the wafer with a silane primer;

after providing the back side with a silane primer, adhesively bonding a wafer-sized fiber reinforced synthetic resin sheet onto the back side of the wafer to form a wafer assembly that includes the wafer and the fiber reinforced synthetic resin sheet;

removing the wafer from the temporary carrier;

after removing the wafer, sawing into the wafer assembly front the chip side to a predetermined depth to form kerfs;

applying a fight-sensitive polymer on the chip side of the wafer assembly;

exposing and developing thc light-sensitive polymer so that the kerfs are coated on both sides with the polymer; and sawing the wafer assembly into individual "chips" from the side that bus the synthetic resin sheet. to form a wafer assembly the wafer.sized fiber reinforced synthetic resin sheet including via holes in the same pitch as the solder balls;

wherein thinning a backside of the wafer comprises thinning the wafer wet-chemically from the back side;

wherein applying a polymer comprises applying a light-sensitive polymer on the chip side of the wafer assembly and exposing and developing the light sensitive polymer so that the kerfs are coated on both sides with the plynier; the method further comprising:

printing the wafer assembly with a symthetic resin; providing solder balls to a side of the wafer assembly that has the vie boles and is opposite from the wafer. s opposite from the wafer.

* * * * *

UNITED STATES PATENT AND TRADEMARK OFFICE
CERTIFICATE OF CORRECTION

PATENT NO. : 7,091,062 B2
APPLICATION NO. : 10/967020
DATED : August 15, 2006
INVENTOR(S) : Geyer It is certified that error appears in the above-identified patent and that said Letters Patent is hereby corrected as shown below:

Column 7, line 38; delete "inchides" insert --includes--
Column 7, line 40; delete "chip 'side" insert --chip side--
Column 7, line 45; delete "end" insert --and--
Column 7, line 47; delete "thc" insert --the--
Column 7, line 51; delete "kerfas" insert --kerfs--
Column 7, line 54; delete "aide" insert --side--
Column 7, line 58; delete "claim of wherein" insert --claim 2 wherein--
Column 7, line 61; delete "claim wherein" insert --claim 1 wherein--
Column 8, line 6; delete ".down" insert --down--
Column 8, line 7; delete "wafer.sized" insert --wafer-sized--
Column 8, line 15; delete "light sensitive" insert --light-sensitive--
Column 8, line 17; delete "plynier" insert --polymer--
Column 8, line 18; delete "symthetic" insert --synthetic--
Column 8, line 20; delete "vie boles" insert --via holes--
Column 8, line 28; delete "shoot" insert --sheet--
Column 8, line 39; delete "end" insert --and--
Column.8, line 40; delete "Ibe" insert --the--
Column 8, line 41; delete "Tibet" insert --fiber--
Column 8, line 50; delete "Thc" insert --The--
Column 8, line 63; delete "Th." insert --The--
Column 8, line 68; delete "and." insert --and is opposite fro the wafer.--
Column 9, line 5; delete "wet-ethnically" insert --wet-chemically--
Column 9, line 18; delete "front" insert --from--
Column 9, line 20; delete "fight-sensitive" insert --light-sensitive--
Column 10, line 1; delete "thc" insert --the--
Column 10, line 5; delete "sheet." insert --sheet--
Column 10, line 6; delete "wafer.size" insert --wafer-size--
Column 10, line 15; delete "plynier" insert --polymer--
Column 10, line 18; delete "vie boldes" insert --via holes--

UNITED STATES PATENT AND TRADEMARK OFFICE
CERTIFICATE OF CORRECTION

PATENT NO.        : 7,091,062 B2
APPLICATION NO.   : 10/967020
DATED             : August 15, 2006
INVENTOR(S)       : Geyer It is certified that error appears in the above-identified patent and that said Letters Patent is hereby corrected as shown below:

Column 10, line 18; delete "wafer. s" insert --wafer--

Signed and Sealed this

Second Day of January, 2007

JON W. DUDAS
*Director of the United States Patent and Trademark Office*